(12) United States Patent
Ogura

(10) Patent No.: US 7,402,474 B2
(45) Date of Patent: Jul. 22, 2008

(54) MANUFACTURING METHOD OF SEMICONDUCTOR DEVICE

(75) Inventor: Takashi Ogura, Gunma (JP)

(73) Assignee: Sanyo Electric Co., Ltd., Osaka (JP)

( * ) Notice: Subject to any disclaimer, the term of this patent is extended or adjusted under 35 U.S.C. 154(b) by 280 days.

(21) Appl. No.: 11/233,648

(22) Filed: Sep. 23, 2005

(65) Prior Publication Data

US 2006/0068538 A1 Mar. 30, 2006

(30) Foreign Application Priority Data

Sep. 29, 2004 (JP) ............................ P2004-285024

(51) Int. Cl.
H01L 21/027 (2006.01)
(52) U.S. Cl. .................. 438/197; 438/128; 438/275; 438/448; 438/591; 257/392; 257/395; 257/E21.552
(58) Field of Classification Search ................. 438/448, 438/128, 275, 591, 592, 981; 257/392, 395, 257/509, E21.552
See application file for complete search history.

(56) References Cited

U.S. PATENT DOCUMENTS

| | | | | |
|---|---|---|---|---|
| 4,897,364 A | * | 1/1990 | Nguyen et al. | 438/448 |
| 5,039,625 A | * | 8/1991 | Reisman et al. | 438/297 |
| 5,439,842 A | * | 8/1995 | Chang et al. | 438/448 |
| 5,977,607 A | * | 11/1999 | Hodges et al. | 257/509 |
| 6,066,881 A | * | 5/2000 | Shimizu et al. | 257/392 |
| 6,376,316 B2 | * | 4/2002 | Shukuri et al. | 438/275 |
| 2001/0053579 A1 | * | 12/2001 | Toda et al. | 438/275 |
| 2004/0113208 A1 | * | 6/2004 | Sekikawa et al. | 257/368 |

FOREIGN PATENT DOCUMENTS

| | | |
|---|---|---|
| JP | 2004-039681 | 2/2004 |
| JP | 2004-104141 | 4/2004 |

* cited by examiner

*Primary Examiner*—Eugene Lee
*Assistant Examiner*—Peniel M Gumedzoe
(74) *Attorney, Agent, or Firm*—Fish & Richardson P.C.

(57) ABSTRACT

A method of manufacturing a semiconductor device comprises the following steps: a step of depositing a silicon oxide film on the top surface of an epitaxial layer of the region where a high withstand voltage MOS transistor is formed; a step of subsequently depositing a silicon oxide film on the top surface of the epitaxial layer according to the thickness of a gate oxide film of a low withstand voltage MOS transistor; and a step of subsequently adjusting the thickness of the silicon oxide film on the top surface of the high withstand voltage MOS transistor by etching and forming a P-type diffusion layer by ion-implantation method. This method can manufacture elements having gate oxide films different in thickness at low cost.

4 Claims, 4 Drawing Sheets

MANUFACTURING METHOD OF SEMICONDUCTOR DEVICE

Priority is claimed to Japanese Patent Application Number JP2004-285024 filed on Sep. 29, 2004, the disclosure of which is incorporated herein by reference in its entirety.

BACKGROUND OF THE INVENTION

1. Field of the Invention

The present invention relates to a technology of forming high and low withstand voltage semiconductor devices by adjusting thickness of a gate oxide film.

2. Description of the Related Art

In a conventional method of manufacturing a semiconductor device, an element isolating insulator film is formed on the surface of a silicon substrate. A gate oxide film 100 nm thick is formed within an element formation region surrounded with the element isolating insulator film. A polycrystalline silicon layer is then formed selectively on the top surface of a gate oxide film as a gate electrode. Subsequently, impurities are ion-implanted from the top surface of the gate oxide film using the gate electrode as a mask. A diffusion layer is then formed as a drain region and a source region. This technology is described for instance in FIGS. 2-3 pp. 4-5 in Japanese Patent Application Publication No. 2004-39681.

In an alternative conventional method of manufacturing a semiconductor device, the technology taking the following steps is known. When forming high and low withstand voltage circuits on one substrate, a sacrificial oxide film about 100 nm thick is first formed on the top surface of the substrate. In a region where the high withstand voltage circuit is to be formed, impurities are ion-implanted at an acceleration voltage of about 150 keV from the top surface of the sacrificial oxide film. A well region is then formed in a region where a PMOS transistor of the high withstand voltage circuit, or the like is to be formed. Subsequently, the sacrificial oxide film is removed, and a first gate oxide film about 13 nm thick is formed on the top surface of the substrate of the region where both the circuits are formed. A well region is then formed in a region where a PMOS transistor of the low withstand voltage circuit, or the like is formed. Furthermore, a second gate oxide film about 8 nm thick is formed on the top surface of the substrate of the region where both the circuits are formed so as to form the PMOS transistors of both the circuits or the like. This technology is described for instance in FIGS. 1, 6-11, pp. 6-9 in Japanese Patent Application Publication No. 2004-104141.

As described above, in the conventional methods of manufacturing a semiconductor device, a gate oxide film 100 nm thick is deposited on a region which is surrounded by an element isolating insulator film formed on surface of the silicon substrate. At the same time, the gate oxide film is also deposited in the above thickness on the top surface of the region where a drain region and a source region to be formed. In a self-alignment manner with respect to a gate electrode formed on the top surface of the gate oxide film, a diffusion layer is formed as the drain and source regions. This manufacturing method determines the thickness of the oxide film on the top surface of the drain and source regions depending on the thickness of the gate oxide film. Accordingly, depending on the thickness, an acceleration voltage is determined for when ion-implanting impurities. As a result, if an acceleration voltage increases at ion-implantation, impurities go through the gate electrode, thereby preventing the separate formation of the drain and source regions. At the same time, in order to prevent impurities from going through the gate electrode, the acceleration voltage has to be equal to or lower than a certain value. In this case, however, there is an upper limit to the thickness of the gate oxide film, with the result that a high withstand voltage MOS transistor requiring a desired withstand voltage characteristic sometimes cannot be formed.

Also in the conventional methods of manufacturing a semiconductor device, a sacrificial oxide film is deposited on the top surface of the substrate of the region where the high withstand voltage circuit and the low withstand voltage circuit are formed. The sacrificial oxide film is used as an oxide film at a time when forming the well region in the region where the high withstand voltage circuit is formed. Then after forming the element isolating insulator film in the high and low withstand voltage circuits, the sacrificial oxide film is removed. Subsequently, a gate oxide film of desired thickness is deposited on each of the regions where the high and low withstand voltage circuits are formed. This manufacturing method requires the sacrificial oxide film to be formed by the time the element isolating insulator film is formed. As a result, its cost becomes higher and manufacturing steps become complicated.

SUMMARY OF THE INVENTION

The present invention provides a method of manufacturing a semiconductor device. In the method of manufacturing a semiconductor device, a semiconductor layer is prepared, and a first MOS transistor and a second MOS transistor having a gate oxide film thinner than that of the first MOS transistor are formed in a plurality of element formation regions partitioned by an isolation region formed in the semiconductor layer, is characterized by comprising the following steps: a step of selectively forming a first insulator film on the surface of the semiconductor layer in the formation region of the first MOS transistor and then forming a second insulator film on the surface of the semiconductor layer in the formation regions of the first and second MOS transistors; a step of forming a gate electrode in the formation region of the first MOS transistor, and thinning the first and second insulator films on the top surfaces of the formation regions of a drain region and a source region located adjacent to the gate electrode; and a step of ion-implanting impurities from above the semiconductor layer so as to form the drain and source regions in the semiconductor layer. The present invention, therefore, comprises a step of depositing the first and second insulator films on the surface of the semiconductor layer according to the thickness of the gate oxide film. Under the ion-implantation conditions of the first MOS transistor, the first and second insulator films are selectively removed. This manufacturing method allows the first and second MOS transistors, which have gate oxide films different in thickness, to be formed monolithically.

Furthermore, in the method of manufacturing a semiconductor device according to the present invention, the step of thinning the first and second insulator films is characterized by removing the second insulator film in the formation region of the second MOS transistor in the same step. In the present invention, therefore, when selectively removing the first and second insulator films of the first MOS transistor, the second insulator film of the second MOS transistor is also removed. Since this manufacturing method can reduce the number of masks, its manufacturing cost can be reduced and the manufacturing steps can be simplified.

Also, in the method of manufacturing a semiconductor device according to the present invention, the step of forming the drain and source regions is characterized by thinning the first and second insulator films using the gate electrode and then ion-implanting from above the gate electrode. Therefore, the present invention forms the drain and source regions by self-alignment technology using the gate electrode as a mask. This manufacturing method allows the drain and source regions to be formed accurately in position corresponding to the gate electrode.

Furthermore, in the method of manufacturing a semiconductor device according to the present invention, the step of forming the gate electrode is characterized by forming a first silicon film and a silicon nitride film on the top surface of the second insulator film so that an opening part will be provided in the region where a field oxide film is to be formed; forming the field oxide film in the semiconductor layer with the first silicon film and the silicon nitride film as a mask; and then removing the silicon nitride film; depositing a second silicon film on the top surface of the first silicon film; and selectively removing the first and second silicon films. In the present invention, therefore, the field oxide film is formed being coated with the first silicon film which uses the first and second insulator films as a gate oxide film used for the gate electrode. This manufacturing method can suppress growth of the first and second insulator films used as the gate oxide film and can form a gate oxide film of desired thickness.

DESCRIPTION OF THE PREFERRED EMBODIMENT

Hereinafter, a method of manufacturing a semiconductor device as one preferred embodiment of the present invention will be described in further detail with reference to FIGS. 1 to 8.

FIGS. 1 to 8 are cross-sectional views showing the method of manufacturing a semiconductor device according to this embodiment. Note that the following description relates to the case in which for example, a P-channel type MOS transistor capable of withstanding high voltage and an N-channel type MOS transistor capable of withstanding low voltage are formed in an element formation region partitioned by an isolation region. However, the embodiment of the present invention is not limited to this combination, and is applicable to, for example the case in which a semiconductor integrated circuit device is formed by forming an NPN-type transistor, an upright-type PNP transistor or the like in another element formation region.

Figure 1:
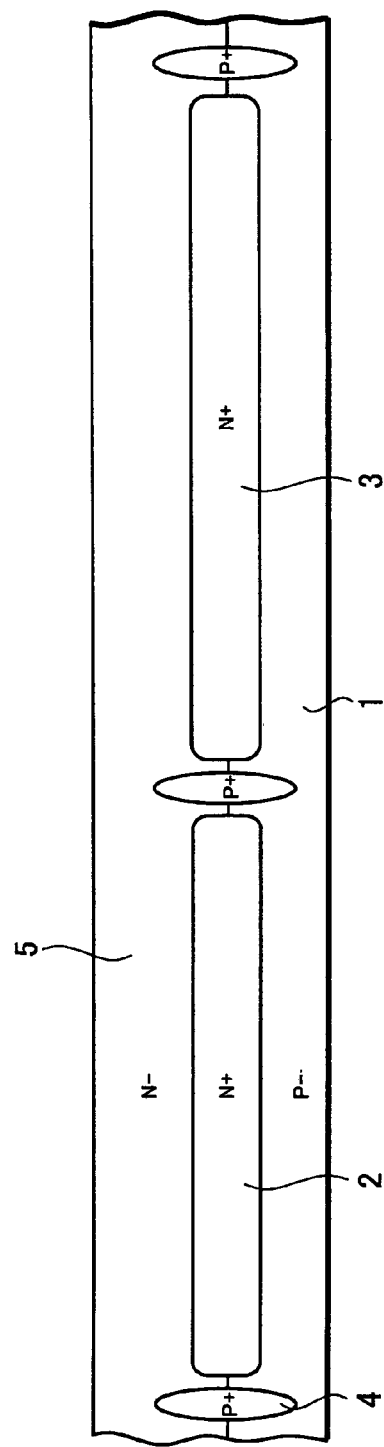
FIG. 1 is a cross-sectional view showing a method of manufacturing a semiconductor device according to an embodiment of the present invention.

Firstly, as shown in FIG. 1, a P-type single-crystal silicon substrate 1 is prepared. N-type impurities such as phosphorus (P) are ion-implanted from the surface of the substrate 1 using the heretofore known photo-lithography technology so as to form N-type buried diffusion layers 2, 3. Next, P-type impurities such as boron (B) are ion-implanted from the surface of the substrate 1 using the heretofore known photo-lithography technology so as to form a P-type buried diffusion layer 4. Subsequently, the substrate 1 is located on a susceptor of an epitaxial growth system. The substrate 1 is heated by a lamp to a high temperature of about 1200° C., and $SiHCl_3$ gas and $H_2$ gas are introduced into a reaction tube. This grows, for example, an epitaxial layer 5 about 0.5-1.5 μm thick having a resistivity of 0.1-2.0 Ωcm on the substrate 1.

Note that the substrate 1 and the epitaxial layer 5 in this embodiment correspond to a "semiconductor layer" in the present invention. This embodiment, although relating to the case in which one layer of the epitaxial layer 5 is formed on the substrate 1, is not limited to this case. For example, the "semiconductor layer" of the embodiment of the present invention may be only a substrate and may be a plurality of epitaxial layers stacked on the top surface of the substrate. Furthermore, the substrate may be an N-type single-crystal silicon substrate or a compound semiconductor substrate.

Figure 2:
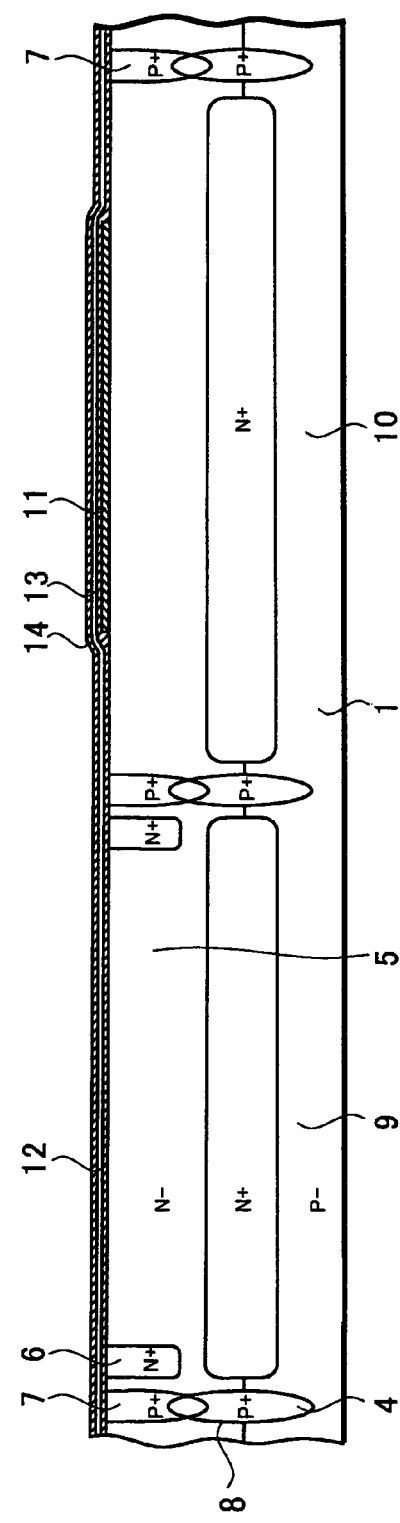
FIG. 2 is a cross-sectional view showing the method of manufacturing a semiconductor device according to the embodiment of the present invention.

Next, as shown in FIG. 2, N-type impurities such as phosphorus (P) are ion-implanted from the surface of the epitaxial layer 5 using the heretofore known photo-lithography technology so as to form an N-type diffusion layer 6. P-type impurities such as boron (B) are ion-implanted from the surface of the epitaxial layer 5 using the heretofore known photo-lithography technology so as to form a P-type diffusion layer 7. The P-type buried diffusion layer 4 and the diffusion layer 7 are then connected thereby forming an isolation region 8. As described above, the substrate 1 and the epitaxial layer 5 are partitioned into a plurality of element formation regions by the isolation region 8. In this embodiment, the N-channel type MOS transistor capable of withstanding low voltage is formed in a first element formation region 9, and the P-channel type MOS transistor capable of withstanding high voltage is formed in a second element formation region 10.

Note that the P-channel type MOS transistor capable of withstanding high voltage in this embodiment corresponds to a "first MOS transistor" in the present invention, and that the N-channel type MOS transistor capable of withstanding low voltage in this embodiment corresponds to a "second MOS transistor" in the present invention. For the "first MOS transistor" and the "second MOS transistor" in the embodiment of the present invention, their gate oxide films have to be different in thickness.

Next, for example, a silicon oxide film 11 of about 800-1200 Å is deposited on the surface of the epitaxial layer 5. Since the P-channel type MOS transistor capable of withstanding high voltage is formed in the second element formation region 10, a gate oxide film withstanding high voltage has to be formed. Therefore, the silicon oxide film 11 is selectively removed so that the silicon oxide film 11 will remain on the surface of the second element formation region 10. Subsequently, considering the thickness of the gate oxide film of the N-channel type MOS transistor capable of withstanding low voltage in the first element formation region 9, for example, a silicon oxide film 12 of about 150-350 Å is deposited on the surface of the epitaxial layer 5. On the top surface of the silicon oxide film 12, a polysilicon film 13 and a silicon nitride film 14 are deposited in order.

Note that the silicon oxide film 11 in this embodiment corresponds to a "first insulator film" in the present invention, and the silicon oxide film 12 in this embodiment corresponds to a "second insulator film" in the present invention. For the "first insulator film" and the "second insulator film" in the embodiment of the present invention, any film is applicable as long as it can be used as a gate oxide film. Furthermore, the polysilicon film 13 in this embodiment corresponds to the "first silicon film" in the present invention. For the "first silicon film" in the embodiment of the present invention, any film is applicable as long as it composes a gate electrode.

Figure 3:
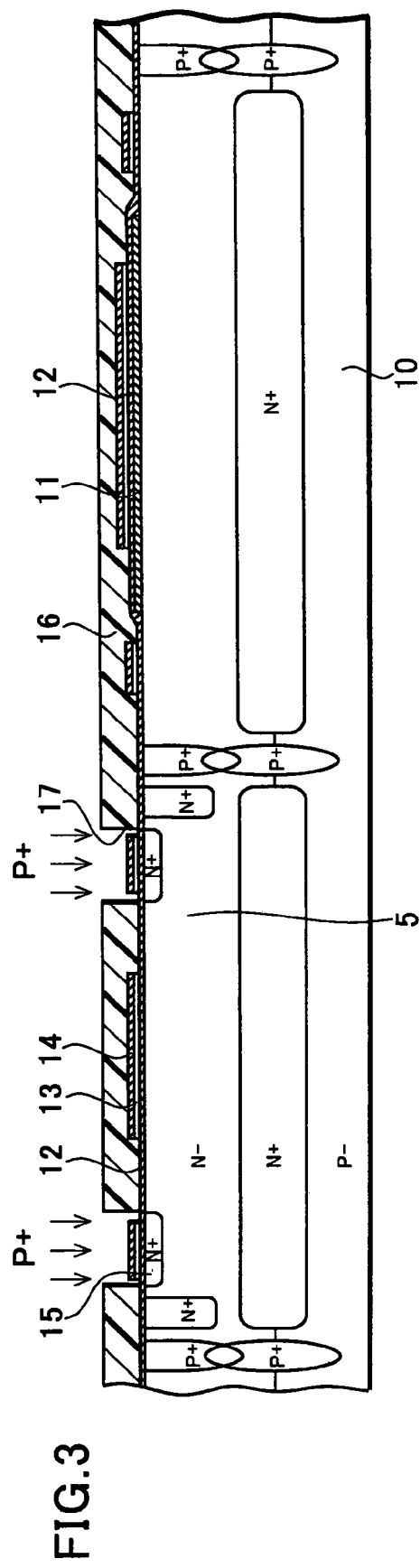
FIG. 3 is a cross-sectional view showing the method of manufacturing a semiconductor device according to the embodiment of the present invention.
Figure 4:
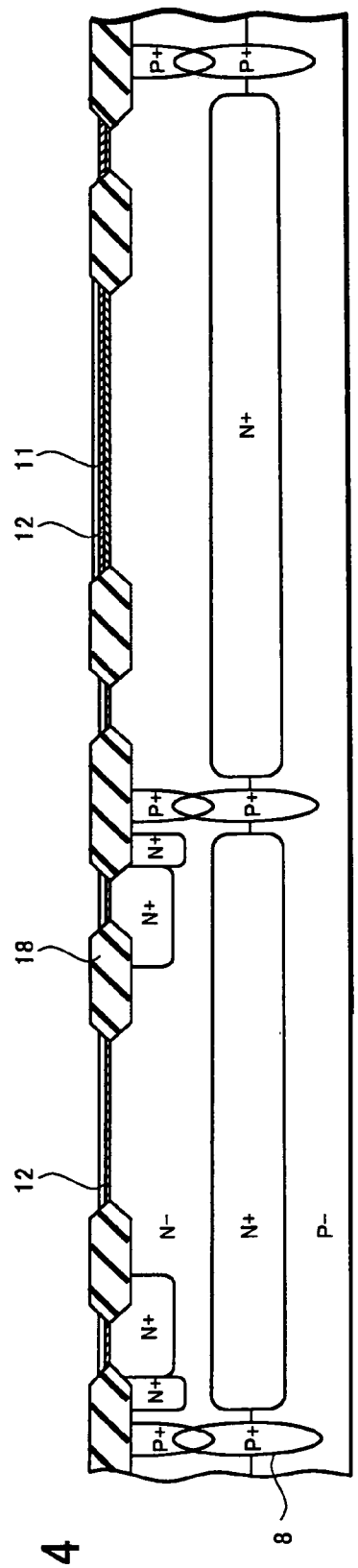
FIG. 4 is a cross-sectional view showing the method of manufacturing a semiconductor device according to the embodiment of the present invention.

Next, as shown in FIG. 3, the polysilicon film 13 and the silicon nitride film 14 are selectively removed so that an opening part will be provided in the part where a LOCOS oxide film 18 is to be formed (see FIG. 4). At this time, although not shown in the drawings, the formation of the N-type buried diffusion layer 2 results in a level difference in a scribe line region on the surface of the substrate 1. Using this level difference as an alignment mark, the polysilicon film 13 and the silicon nitride film 14 are selectively removed.

Subsequently, a photoresist 16 for forming an N-type diffusion layer 15 used as the drain region is formed on the surface of the epitaxial layer 5. Using the heretofore known photo-lithography technology, an opening part 17 is then formed on the top surface of the region of the photoresist 16 in which the N-type diffusion layer 15 is formed.

In this case, the level difference between the polysilicon film 13 and the silicon nitride film 14 which have been already located on the surface of the epitaxial layer 5 can be used as an alignment mark. N-type impurities such as phosphorus (P) are then ion-implanted with the photoresist 16 as a mask so as to form the N-type diffusion layer 15. This manufacturing method can form the N-type diffusion layer 15 regardless of a shape of the LOCOS oxide film 18 such as bird's beak thickness, bird's beak shape or the like.

Note that the LOCOS oxide film 18 in this embodiment corresponds to a "field oxide film" in the present invention, but the present invention is not limited to the case of forming by the LOCOS method. The "field oxide film" of the embodiment of the present invention may be formed by a manufacturing method capable of forming a thick thermal oxide film.

Next, as shown in FIG. 4, using the polysilicon film 13 and the silicon nitride film 14 as a mask, an oxide film is formed on the silicon oxide films 11 and 12, for example by steam oxidation at about 800-1200° C. At the same time, the entire substrate 1 is heat-treated so as to form the LOCOS oxide film 18. At this time, a bird's beak is formed partially in the part where the polysilicon film 13 and the silicon nitride film 14 are formed. Note that the LOCOS oxide film 18 is formed to have a thickness of, for example about 3000-5000 Å in its flat part. Particularly on the isolation region 8, the LOCOS oxide film 18 is formed thereby separating elements from each other. Subsequently, the silicon nitride film 14 is removed.

Figure 5:
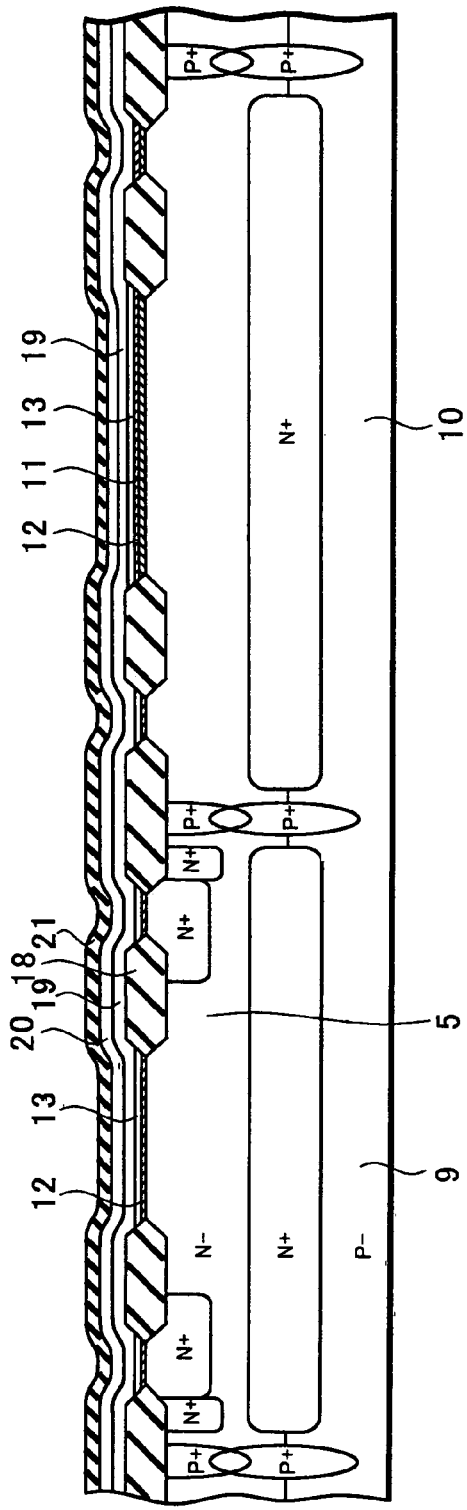
FIG. 5 is a cross-sectional view showing the method of manufacturing a semiconductor device according to the embodiment of the present invention.

Next, as shown in FIG. 5, on the top surface of the polysilicon film 13 or LOCOS oxide film 18, a polysilicon film 19, a tungsten silicon film 20 and a silicon oxide film 21 are deposited in order. At this time, the silicon oxide film 12 remaining on the surface of the epitaxial layer 5 is used as a gate oxide film in the first element formation region 9. In the second element formation region 10, the silicon oxide films 11 and 12 remaining on the surface of the epitaxial layer 5 are similarly used as a gate oxide film. On the top surface of the polysilicon film 13 remaining on the top surface of the silicon oxide film 12, the polysilicon film 19 and the tungsten silicon film 20 are further deposited to a desired thickness to be used as gate electrodes 22 and 23 (see FIG. 6). Note that the polysilicon film 19 and the tungsten silicon film 20 in this embodiment correspond to a "second silicon film" in the present invention. For the "second silicon film" of the present invention, any film is applicable as long as it composes a gate electrode.

As described above using FIG. 2, at this time, after depositing the silicon oxide film 12, the polysilicon film 13 is deposited. Until the LOCOS oxide film 18 is formed and the polysilicon film 19 is deposited, the silicon oxide film 12 is being coated with the polysilicon film 13. This manufacturing method can drastically reduce the growth increment of the silicon oxide films 11 and 12 caused by oxidation. Consequently, the gate oxide film thicknesses of the N- and P-channel type MOS transistors are maintained within an appropriate range.

Furthermore, the silicon oxide films 11 and 12 used as a gate oxide film and the polysilicon film 13 used as the gate electrodes 22 and 23 are used as a mask for forming the LOCOS oxide film 18. This manufacturing method can omit steps of depositing and removing the silicon oxide film for forming the LOCOS oxide film 18, thereby simplifying the manufacturing steps and reducing the manufacturing cost.

Note that the polysilicon films 13 and 19 are formed in two steps of depositing so as to have a desired thickness in this embodiment. This manufacturing method can thin the polysilicon film 13 and make the patterning for forming the LOCOS oxide film 18 easier. In this embodiment, however, a polysilicon film suitable for the thickness of the gate electrodes 22 and 23 may be formed on the surface of the silicon oxide film 12 in one step of depositing.

Figure 6:
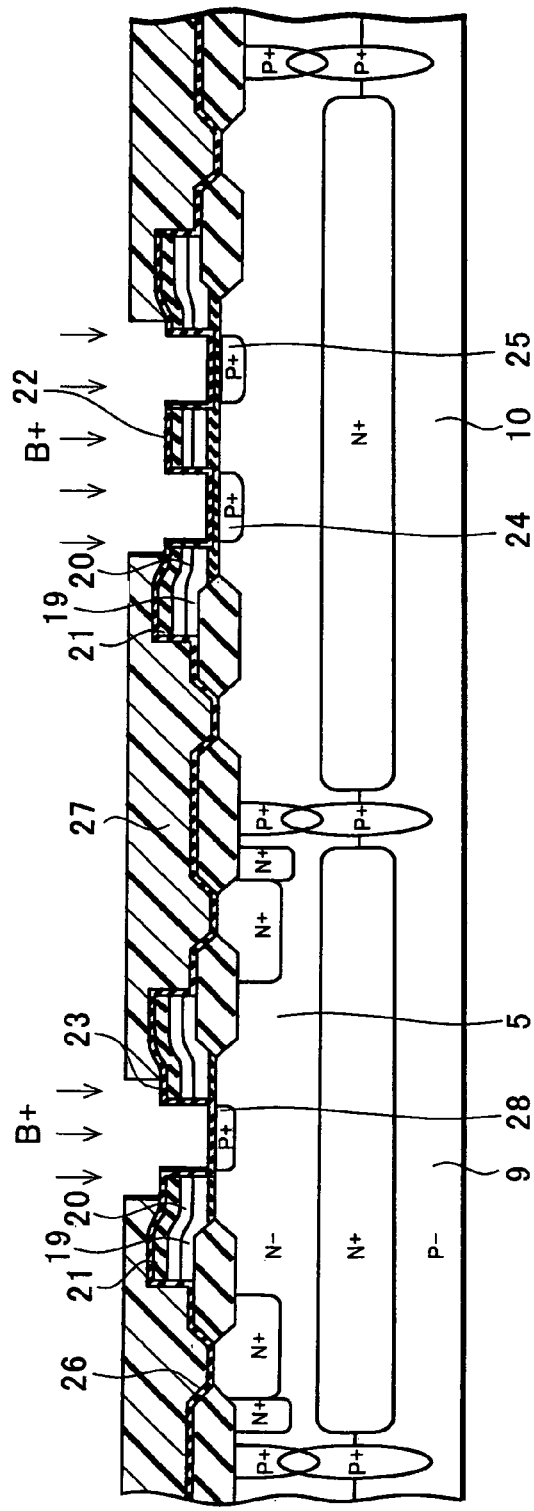
FIG. 6 is a cross-sectional view showing the method of manufacturing a semiconductor device according to the embodiment of the present invention.

Next, as shown in FIG. 6, in the first and second element formation regions 9, 10, the polysilicon film 19, the tungsten silicon film 20 and the silicon oxide film 21 are selectively removed. The gate electrodes 22, 23 or the like are then formed, and the silicon oxide films 11 and 12 are selectively removed with the gate electrodes 22 and 23 as a mask in the same etching step.

As described above, only the silicon oxide film 12 is deposited on the surface of the epitaxial layer 5 in the first element formation region 9. At the same time, the silicon oxide films 11 (see FIG. 2) and 12 are deposited on the surface of the epitaxial layer 5 in the second element formation region 10. P-type impurities such as boron (B) are then ion-implanted so as to form P-type diffusion layers 24 and 25. The P-type diffusion layers 24 and 25 become drain and source regions of the P-channel type MOS transistor. Note that the silicon oxide films 11 and 12 in the second element formation region are integrally shown as the silicon oxide film 12 in FIG. 6 or later. Furthermore, the polysilicon films 13 and 19 in the first and second element formation regions are integrally shown as the polysilicon film 19.

At the same time, the P-type diffusion layers 24 and 25 are formed in the second element formation region 10 using the gate electrode 22 by the self-alignment technology. If boron (B) goes through the gate electrode 22, the drain and source regions cannot be formed to be partitioned. As a result, in order to ion-implant boron (B) at an acceleration voltage of about 30-60 keV, the silicon oxide film on the top surface of the epitaxial layer 5 has to be about 400-800 Å thick, for example. Specifically, the steps of forming the drain and source regions are performed at an acceleration voltage at which impurities do not go through the gate electrode 22. The thicknesses of the silicon oxide films 11 and 12 are etched so that impurities will go through the silicon oxide films 11 and 12 at the acceleration voltage.

At the same time, on the top surface of the region where the P-type diffusion layers 24 and 25 are formed, the silicon oxide films 11 and 12 are deposited about 1000 Å-1400 Å for example. As a result, the silicon oxide films 11 and 12 in the region where the P-type diffusion layers 24, 25 are formed have to be removed selectively by etching. If removing the silicon oxide films 11 and 12 using the heretofore known photo-lithography technology only in the region where the P-type diffusion layers 24 and 25 are formed, the number of masks increases. The increase in the number of masks results in a higher manufacturing cost. Accordingly, etching can also be performed with a patterned photoresist being unformed. In this case, in the region where only the silicon oxide film 12 is deposited, there exists a region where the surface of the epitaxial layer 5 is overetched, for example by a thickness of about 100 Å.

Figure 8:
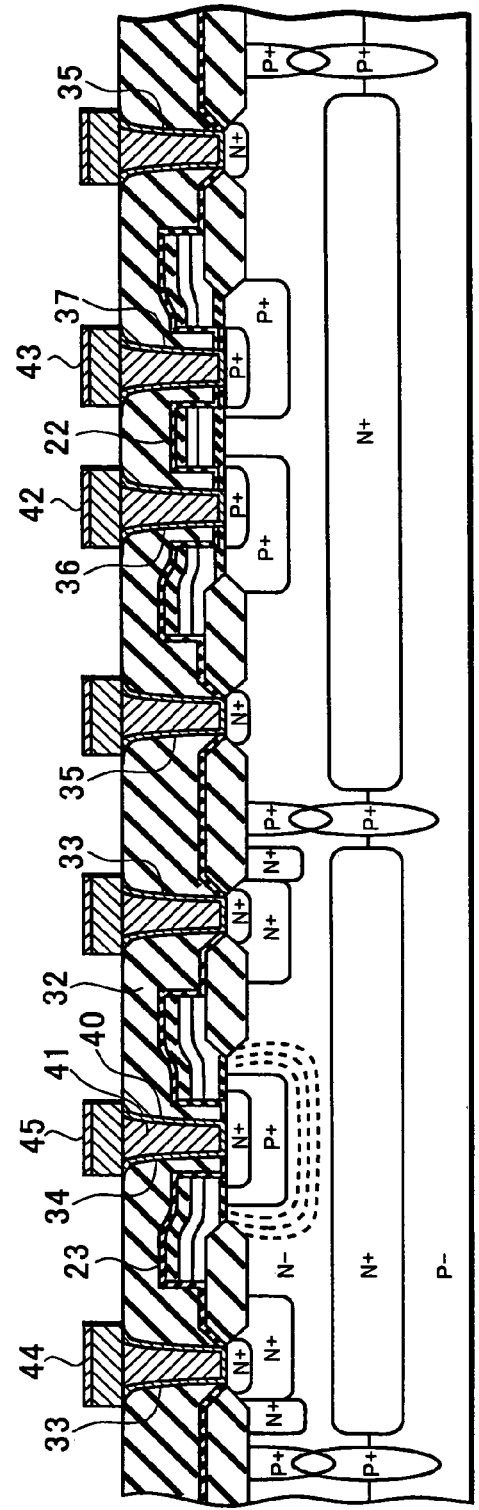
FIG. 8 is a cross-sectional view showing the method of manufacturing a semiconductor device according to the embodiment of the present invention.

However, even if the epitaxial layer 5 is slightly overetched, there is unlikely to be a significant impact on the breakdown voltage characteristic or the like of the N-channel type MOS transistor capable of withstanding low voltage. The reason is as follows. As shown in FIG. 8 by the dotted line, a depletion layer extends deeply into the epitaxial layer 5 having low impurity concentration. This results in a structure where the overetched region has difficulty in existing in the region where the depletion layer is formed. It is contemplated that neither does this structure cause an electric field concentration in the overetched region, nor does degrade the breakdown voltage characteristic. Specifically, in this embodiment, when selectively removing the silicon oxide films 11 and 12 on the top surface of the region where the P-type diffusion layers 24 and 25 are formed, the entire epitaxial layer 5 is etched. This manufacturing method can reduce the number of masks thereby reducing the manufacturing cost. Furthermore, the manufacturing steps can be simplified.

Note that the silicon oxide films 11 and 12 are preliminary deposited on the surface of the epitaxial layer 5 as described above. The silicon oxide films 11 and 12 are dry-etched using the gate electrode 22 by the self-alignment technology. This manufacturing method prevents degradation of the breakdown voltage characteristic caused by the side etching of the silicon oxide films 11 and 12 in the lower portion of the gate electrode 22.

Subsequently, a TEOS film 26 is deposited on the top surface of the epitaxial layer 5, and a photoresist 27 is deposited on the top surface of the TEOS film 26. Using the heretofore known photo-lithography technology, in the first element formation region 9, an opening part is formed in the region of the photoresist 27, where a P-type diffusion layers 28 is formed. In the second element formation region 10, an opening part is formed in the region of the photoresist 27, where the P-type diffusion layers 24 and 25 are formed. P-type impurities such as boron (B) are then ion-implanted with the photoresist 27 as a mask so as to form the P-type diffusion layers 24, 25 and 28. In this case, as shown in the figure, the P-type diffusion layers 24, 25 and 28 are formed using the gate electrodes 22 and 23 by the self-alignment technology.

Figure 7:
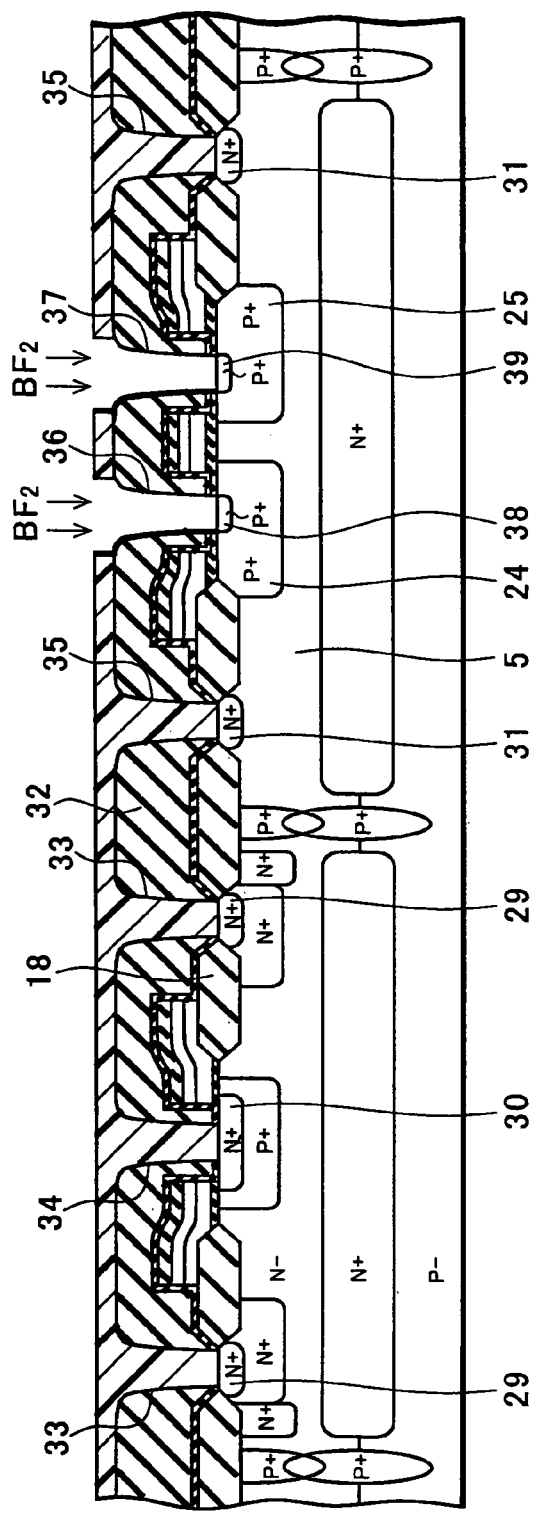
FIG. 7 is a cross-sectional view showing the method of manufacturing a semiconductor device according to the embodiment of the present invention.

Next, as shown in FIG. 7, N-type impurities such as phosphorus (P) are ion-implanted from the surface of the epitaxial layer 5 using the heretofore known photo-lithography technology so as to form N-type diffusion layers 29, 30 and 31. The N-type diffusion layer 29 is used as a drain lead-out region. The N-type diffusion layer 30 is used as a source region. As shown in the figure, the N-type diffusion layers 29, 30 and 31 are formed using the LOCOS oxide film 18 by the self-alignment technology.

Subsequently, on the top surface of the epitaxial layer 5, for example, a BPSG (Boron Phospho Silicate Glass) film or an SOG (Spin On Glass) film is deposited as an insulating layer 32. For example, by dry etching using $CHF_3+O_2$ gas, contact holes 33, 34, 35, 36 and 37 are formed in the insulating layer 32. Using the heretofore known photo-lithography technology, P-type impurities such as boron fluoride (BF) are ion-implanted so as to form P-type diffusion layers 38 and 39. In this case, the P-type diffusion layers 38 and 39 are formed using the contact holes 36 and 37 by the self-alignment technology. This manufacturing method allows the P-type diffusion layers 38 and 39 to be formed accurately in position corresponding to the P-type diffusion layers 24 and 25.

Next, as shown in FIG. 8, a barrier metal film 40 is formed on the inner walls of the contact holes 33, 34, 35, 36, 37 or the like. A tungsten (W) film 41 is then buried in the contact holes 33, 34, 35, 36 and 37. An aluminum copper (AlCu) film and a barrier metal film are deposited on the top surface of the tungsten film 41, by the CVD method. Subsequently, the aluminum copper film and the barrier metal film are selectively removed using the heretofore known photo-lithography technology. A drain electrode 42 and source electrode 43 of the P-channel type MOS transistor are then formed. A drain electrode 44 and source electrode 45 of the N-channel type MOS transistor are further formed. Note that although the cross section shown in FIG. 8 does not show a wiring layer to the gate electrodes 22 and 23, another region is connected to the wiring layer.

As described above, while this embodiment has described the case in which the LOCOS oxide film is formed in the region where the MOS transistor is formed, after preliminarily forming the silicon oxide film as a gate oxide film, the present invention is not limited to this case. A similar manufacturing method is applicable even when forming the silicon oxide film as a gate oxide film after forming the LOCOS oxide film. Additionally, various changes may be made without departing from the scope of the present invention.

The embodiment of the present invention comprises the step of selectively thinning the oxide film on the top surface of the drain and source regions of the high withstand voltage MOS transistor. This manufacturing method can reduce the number of masks thereby suppressing the manufacturing cost when forming the high and low withstand voltage MOS transistors on the same substrate which have gate oxide films different in thickness.

Furthermore, the embodiment of the present invention selectively removes the oxide film on the top surfaces of the drain and source regions in the high withstand voltage MOS transistor by the self-alignment technology using the gate electrode. Also using the gate electrode by the self-alignment technology, the drain and source regions are formed. This manufacturing method allows the drain and source regions to be formed accurately in position corresponding to the gate electrode.

Furthermore, the embodiment of the present invention adjusts the thickness of the oxide film on the top surface of the drain and source regions of the high withstand voltage MOS transistor. This manufacturing method can ion-implant impurities at an acceleration voltage at which impurities do not go through the gate electrode. Furthermore, the thickness of the gate oxide film of the high withstand voltage MOS transistor can be designed within a desired range.

Furthermore, the embodiment of the present invention uses the gate oxide film and the gate electrode as a mask when forming the field oxide film. This manufacturing method can omit the step of depositing the oxide film or the like for forming the field oxide film. As a result, the manufacturing steps can be simplified and therefore the manufacturing cost can be reduced.

Furthermore, the embodiment of the present invention uses the gate oxide film as a mask for forming the field oxide film, after depositing the gate oxide film with a silicon film, which is a part of the gate electrode, being deposited on the top surface thereof. This manufacturing method prevents the preliminary deposited gate oxide film from growing to exceed a desired thickness on the surface of the semiconductor layer.

What is claimed is:

1. A method of manufacturing a semiconductor device wherein a semiconductor layer is prepared and wherein a first MOS transistor and a second MOS transistor having a gate oxide film thinner than that of the first MOS transistor are formed in a plurality of element formation regions partitioned by an isolation region formed in the semiconductor layer, the method comprising the steps of:

selectively forming a first insulator film on a surface of the semiconductor layer in a formation region of the first MOS transistor;

subsequently forming a second insulator film on a surface of the semiconductor layer in formation regions of the first and second MOS transistors;

forming a first silicon film and a silicon nitride film on a top surface of the second insulator film, wherein the first silicon film and the silicon nitride film include an opening in a region where a field oxide film is to be formed;

forming the field oxide film in the semiconductor layer using the first silicon film and silicon nitride film as a mask and then removing the silicon nitride film;

selectively forming a second silicon film on a top surface of the first silicon film so as to form gate electrodes of the first MOS transistor and the second MOS transistor; and ion-implanting impurities from above the semiconductor layer so as to form a drain region and a source region in the semiconductor layer.

2. The method of manufacturing a semiconductor device according to claim 1, wherein forming the drain region and the source region of the second MOS transistor includes partially thinning the first and second insulator films using the gate electrode for self-alignment.

3. The method of manufacturing a semiconductor device according to claim 2, wherein, forming the drain region and the source region includes performing ion-implantation from above the gate electrode using the gate electrode for self-alignment.

4. The method of manufacturing a semiconductor device according to claim 2 further comprising stopping the thinning prior to the complete removal of the first and second insulator films.

* * * * *